(12) United States Patent
Götz et al.

(10) Patent No.: US 7,068,112 B2
(45) Date of Patent: Jun. 27, 2006

(54) PHASE-CONTROL CIRCUIT ARRANGEMENT AND METHOD FOR OPERATING SAID CIRCUIT ARRANGEMENT

(75) Inventors: Edmund Götz, Dachau (DE); Günter Märzinger, Ulrichsberg (AT); Markus Scholz, München (DE); Christian Muenker, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/136,232

(22) Filed: May 24, 2005

(65) Prior Publication Data

US 2005/0264368 A1    Dec. 1, 2005

Related U.S. Application Data

(63) Continuation of application No. PCT/DE03/03537, filed on Oct. 24, 2003.

(30) Foreign Application Priority Data

Nov. 26, 2002    (DE) ................................. 102 55 145

(51) Int. Cl.
*H03L 7/087*    (2006.01)
(52) U.S. Cl. ............................. 331/25; 331/11; 331/17
(58) Field of Classification Search ................ 331/1 A, 331/10–11, 17–18, 25
See application file for complete search history.

(56) References Cited

U.S. PATENT DOCUMENTS

| 4,105,948 | A | | 8/1978 | Wolkstein |
| 4,743,867 | A | * | 5/1988 | Smith .......................... 332/127 |
| 4,926,141 | A | | 5/1990 | Herold et al. |
| 5,625,325 | A | | 4/1997 | Rotzoll et al. |
| 5,631,587 | A | | 5/1997 | Co et al. |
| 5,648,744 | A | | 7/1997 | Prakash et al. |
| 5,786,733 | A | | 7/1998 | Yamaguchi |

FOREIGN PATENT DOCUMENTS

DE          101 25 373 A1        12/2002

OTHER PUBLICATIONS

International Search Report for Int'l Application No. PCT/DE03/03537, Int'l Filing Date Oct. 24, 2003, 2 pgs.

* cited by examiner

*Primary Examiner*—David Mis
(74) *Attorney, Agent, or Firm*—Eschweiler & Associates, LLC

(57) ABSTRACT

A circuit arrangement includes a phase locked loop configured to produce a controlled frequency. The phase locked loop has an actuating input and a control loop output, with it being possible to tap off the frequency at the control loop output. In addition, a frequency meter is provided, which is connected to the control loop output of the phase locked loop. The frequency meter is configured to measure the frequency of the phase locked loop. Finally, a computation unit is provided in order to determine a gradient associated with the phase locked loop and generate a correction value based thereon, wherein the correction value is employed to mitigate a deterioration in the loop bandwidth due to variations in the gradient.

18 Claims, 3 Drawing Sheets

PHASE-CONTROL CIRCUIT ARRANGEMENT AND METHOD FOR OPERATING SAID CIRCUIT ARRANGEMENT

REFERENCE TO RELATED APPLICATIONS

This application is a continuation of PCT/DE03/03537, filed Oct. 24, 2003 which was not published in English, that claims the benefit of the priority date of German Patent Application No. DE 102 55 145.6, filed on Nov. 26, 2002, the contents of which both are herein incorporated by reference in their entireties.

FIELD OF THE INVENTION

The invention relates to a circuit arrangement for phase control, and to a method for operation of the circuit arrangement.

BACKGROUND OF THE INVENTION

A phase locked loop (PLL) is used to set a frequency that is produced by an oscillator such that it corresponds to a reference frequency which is produced by a reference oscillator. The matching must be sufficiently accurate so that the phase shift between the two frequencies does not drift away.

The fundamental design of a phase locked loop as is known from the prior art is shown in FIG. 1. A signal that is produced by a reference oscillator 1 at a reference frequency Fref is passed to a 1/R divider, which divides the reference frequency Fref by a divisor R, and produces at the output a signal at the frequency Fref', which has been divided by R. The signal at the frequency Fref' is compared with a signal at the frequency FVCO' by means of a phase detector 3. For this purpose, the two signals are passed to the phase detector inputs 3.1 and 3.2 of the phase detector 3. At its output 3.3, the phase detector 3 produces an output voltage, which is determined from the phase shift between the signal at the frequency FVCO', which in the following text is also referred to as the slave signal, and the reference signal at the frequency Fref'. The phase detector 3 is followed by a charge pump 4, so that a charge pump current Icp can be produced at the output 4.2 of the charge pump 4, by means of the charge pump 4, via a control input 4.1 of the charge pump 4 and on the basis of the output voltage that is produced by the phase detector 3. The charge pump current Icp is passed to the input 5.1 of a loop filter 5. The voltage Vtune which is produced at the output 5.2 of the loop filter 5, and which is also referred to as the tuning voltage in the following text, is passed to the input 6.1 of a voltage controlled oscillator 6, in order to set the output frequency FVCO of the voltage controlled oscillator 6. The voltage controlled oscillator 6 is often also referred to as a VCO.

In the situation where the phase locked loop PLL is used in a transmitter, the output 6.2 of the voltage controlled oscillator 6 may be followed by a power amplifier 8 in order to amplify the signal and to pass it to an antenna 9. The output signal from the voltage controlled oscillator 6 at the frequency FVCO is passed via a feedback path to a 1/N divider 7, which divides the frequency FVCO down to a frequency FVCO' which has been divided by the divisor N, and, as mentioned, passes this to the input 3.2 of the phase detector 3.

If the frequency FVCO differs from the reference frequency Fref, the phase shift increases in proportion to the time. The control error in the closed control loop in consequence rises (even if the control gain is finite) until the two frequencies Fref' and FVCO' match exactly. The remaining frequency control error thus tends to zero.

The fundamental design of the phase locked loop that is shown in FIG. 1 may, for example, be used in a frequency synthesizer.

In this case, a low-frequency, low-noise reference oscillator is required first of all as a reference oscillator 1 in order to produce a high-frequency carrier frequency with as little noise as possible. The reference frequency Fref which is produced by this is divided by the 1/R divider 2 (which is referred to in the following text as a reference divider) down to a lower frequency Fref', the so-called comparison frequency. The high-frequency output frequency FVCO from the voltage controlled oscillator 6 is divided by the 1/N divider down to the lower frequency FVCO'. The phase difference between the two frequencies Fref' and FVCO' is determined by the phase detector 3, and is converted to a duty cycle. A pulse-width-modulated signal is then produced at the output 3.3 of the phase detector 3. The charge pump 4 evaluates the duty cycle of the pulse-width-modulated signal, and converts the pulse-width-modulated signal in conjunction with the loop filter 5 to the control voltage Vtune, which then controls the voltage controlled oscillator 6.

The loop filter 5 may be in the form of an active or of a passive loop filter. Furthermore, depending on the required technical constraints, the loop filter 5 may be in the form of an integrating loop filter or a non-integrating loop filter. In the situation where the loop filter 5 is in the form of a non-integrating loop filter, the control difference between the two frequencies Fref' and FVCO' is just regulated at zero. However, there may still be a phase control error. If the phase shift is likewise intended to be minimized, it is advantageous for the loop filter 5 to be in the form of an integrating filter.

The embodiment of the 1/N divider 7 may include the use of a fixed, dual or multi-modulus high-frequency divider.

FIG. 2 shows the simplified form of a phase locked loop, for example of the phase locked loop shown in FIG. 1, as a linear model. The nominal variable $\Theta i$ is applied to the positive input of the subtraction unit 25. The controller output variable $\Theta 0/N$ that has been divided by the divisor N is applied to the negative input of the subtraction unit 25. The control difference which results at the output of the subtraction unit is passed to the control path, which is formed from the phase detector and the charge pump, represented by the block 21, the loop filter with the transfer function $Z_F(s)$, represented as the block 22, and the voltage controlled oscillator, represented as the block 23.

The transfer function G(s) for the situation where the control loop is not closed can be derived from this as:

$$G(s) = \frac{\Theta_0}{\Theta_i - \Theta_0} \qquad \text{Equation 1}$$

$$= \frac{K_p Z_F(s) K_0}{sN}$$

$$= \frac{K_{VCO} I_{cp}(1 + sC_1 R_1)}{Ns^2(C_1 + C_2 + sC_1 C_2 R_1)}$$

where
$Z_F(s)$=the transfer function of the loop filter,
KVCO=the gradient of the voltage controlled oscillator,
Icp=the charge pump current C1=a first capacitance of the loop filter,
R1=a first resistance of the loop filter, and
C2=a second capacitance of the loop filter.

In a manner corresponding to this, FIG. 3 shows the transfer function G(jω) for the open control loop. For this purpose, the circular frequency ω is plotted logarithmically on the x-axis of the diagram. The magnitude of the transfer function G(jω) is plotted, likewise logarithmically, on the y-axis. The profile of the transfer function G(jω) in the left-hand area of the diagram, which is annotated with the reference symbol 31, is:

$$|G(j\omega)| \propto \frac{1}{\omega^2} \quad (-40 \text{ dB/decade}) \quad \text{Equation 2}$$

The profile of the transfer function G(jω) in the central area, which is identified by the reference symbol 32, is:

$$|G(j\omega)| \propto \frac{1}{\omega} \quad (-20 \text{ dB/decade}) \quad \text{Equation 3}$$

For the circular frequency ω1:

$$\omega_1 = \frac{1}{R_1 C_1} \quad \text{Equation 4}$$

For the circular frequency ωn:

$$\omega_n = \sqrt{\frac{K_{VCO} I_{cp}}{N(C_1 + C_2)}} \quad \text{Equation 5}$$

For the circular frequency ωL:

$$\omega_L = \frac{\omega_n^2}{\omega_1} \quad \text{Equation 6}$$

And for the circular frequency ω2:

$$\omega_2 = \omega_1 \left(1 + \frac{C_1}{C_2}\right) \quad \text{Equation 7}$$

A simple passive filter has been assumed as the loop filter 5 or 22 with the transfer function $Z_F(s)$, in which a second capacitor C2 is connected in parallel with a first resistor R1 and a first capacitor C1 that are connected in series. The corresponding frequencies ω1, ωn, ωL and ω2 are shown in FIG. 3. The statements that have been made so far relating to the phase locked loop have been based on the assumption that the divisor N is constant.

The loop gain OpenLoopGain of the open control loop is thus:

OpenLoopGain=f(KVCO, Icp, LF(Cx, Rx)), where LF(Cx, Rx) represents the characteristics of the loop filter as a function of the capacitances Cx and of the resistances Rx.

If, in addition, a damping factor D is introduced in the negative feedback path of the phase locked loop, the transfer function H(jω) for the closed control loop situation can be calculated as follows:

$$D = \frac{\omega_n}{2\omega_1} \quad \text{Equation 8}$$

$$H(s) = \frac{\Theta_0}{\Theta_i} \quad \text{Equation 9}$$

$$= \frac{1}{1 + \frac{1}{G(s)}}$$

$$= \frac{\omega_n^2 + 2D\omega_n s}{\omega_n^2 + 2D\omega_n s + s^2\left(1 + \frac{s}{\omega_2}\right)}$$

$$= \frac{\frac{\omega_L^2}{2D^2} + \omega_L s}{\frac{\omega_L^2}{2D^2} + \omega_L s + s^2\left(1 + \frac{s}{\omega_2}\right)}$$

The diagram in FIG. 4, in which the circular frequency is plotted logarithmically on the X-axis and in which the transfer function H(jω) for the closed control loop is plotted, likewise logarithmically, on the Y-axis, shows a good approximation to the spectral profile of the locked-in phase locked loop in the area to the right of the carrier. The loop bandwidth is denoted ωx, and is calculated to be:

$$\omega_x = \sqrt{2D\omega_n \omega_2} = \omega_n \sqrt{1 + \frac{C_1}{C_2}} \quad \text{Equation 10}$$

If the capacitance C2 is equal to zero, that is to say the capacitance C2 does not exist, so that the loop filter 5 comprises just the first resistor R1 and the first capacitance C1 connected in series, this results in the profile which is identified by the reference symbol 42 and is illustrated by dashed lines in FIG. 4. The profile which is identified by the reference symbol 42 has a drop of −20 dB/decade. If the capacitance C2 is greater than zero, this results in the profile of the transfer function H(jω) denoted by the reference symbol 41 in FIG. 4, which then has a drop of −40 dB/decade.

Particularly in the case of frequency synthesizers for wire-free radio systems, it is essential to monitor the loop bandwidth ωx as accurately as possible. This is because the stability of the control loop, the speed of any sudden frequency change and the total phase error of the phase locked loop, and hence the purity of the modulation which interacts with the peak of the phase noise (jitter), are influenced directly or indirectly by the loop bandwidth ωx.

The gradient KVCO of the voltage controlled oscillator, the charge pump current Icp of the charge pump and the components of the loop filter influence the loop bandwidth ωx. Since the gradient KVCO of the voltage controlled oscillator, the charge pump current and the resistors and capacitors in the loop filter do not always have an exactly defined value owing to manufacturing tolerances, fluctuations in the supply voltage, temperature fluctuations, etc, and are thus subject to variations, these influencing factors result in a deterioration in the loop bandwidth ωx, which leads to a decreased in the loop bandwidth ωx. All the discrepancies in the loop bandwidth ωx thus have considerable negative effects on the quality, and thus also on the yield, of the fabricated circuits.

The document U.S. Pat. No. 5,786,733 specifies a phase locked loop in which frequency discrepancies can be detected. The oscillator is preceded by a variable gain amplifier, which is driven as a function of the frequency discrepancies over time.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The invention is directed to a circuit arrangement for phase control, and a method for operation of the circuit arrangement, in which it is possible to compensate for deteriorations in the loop bandwidth caused by fluctuations in the gradient of the voltage controlled oscillator and in the charge pump current and for deteriorations resulting from manufacturing tolerances in the components of the loop filter.

The circuit arrangement according to the invention for phase control has a phase locked loop for production of a controlled frequency with an actuating input and a control loop output, in which the frequency can be tapped off at the control loop output. Furthermore, a frequency meter is provided, and is connected to the control loop output of the phase locked loop in order to measure the frequency. In addition, a computation unit is provided to determine a gradient and, from the gradient, determine a correction value on the basis of the measured frequency, with the computation unit being connected on the output side to the actuating input of the phase locked loop.

The method according to the invention includes measuring a first frequency by means of the frequency meter, and storing the measured first frequency in the first memory. A second frequency is then measured by means of the frequency meter, and is stored in the second memory. The difference between the two stored frequencies is then calculated by means of the computation unit. In a further step, the gradient and the associated correction value are calculated by means of the computation unit with the aid of the calculated difference. Finally, the frequency that is produced by the phase locked loop is corrected with the aid of the correction value.

In one embodiment of the circuit arrangement according to the invention, the frequency meter has a counter. This allows the frequency to be detected very easily and with few additional facilities.

The circuit arrangement according to the invention advantageously has a first and a second memory, which are connected to the frequency meter in order to store a first and a second frequency, which are measured using the frequency meter.

In accordance with one embodiment of the circuit arrangement according to the invention, the phase locked loop has a phase detector with a control input, with the control input forming the actuating input of the phase locked loop. The duty cycle of the pulse-width-modulated signal that is produced by the phase detector can then advantageously be controlled via the control input of the phase detector.

In one embodiment of the circuit arrangement according to the invention, and as an alternative to the previous embodiment, the phase locked loop has a charge pump with a control input, with the control input forming the actuating input. This has the advantage that the charge pump current that is produced by the charge pump can be adapted by means of a correction value.

Furthermore, the circuit arrangement according to the invention in the phase locked loop may have a loop filter with a control input, with the control input forming the actuating input of the phase locked loop. This alternative embodiment to the previous embodiment allows corrective action to be taken on the phase locked loop via the loop filter.

In addition, the phase locked loop of the invention includes a voltage controlled oscillator with a control input forming the actuating input. In this alternative embodiment, the phase locked loop can be influenced directly via the voltage controlled oscillator.

In a further embodiment of the circuit arrangement according to the invention, a control unit is provided in order to control the frequency meter, the memory, the computation unit and the phase detector, or the charge pump or the loop filter or the voltage controlled oscillator.

One development of the method according to the invention for operation of the circuit arrangement provides for the individual process steps to be repeated. This has the advantage that the loop bandwidth can be controlled.

Finally, in the case of the method according to the invention, further frequencies can be measured by means of the frequency meter. The computation unit then interpolates between the measured frequencies, in order to form the difference. This advantageously allows the accuracy to be further increased.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention will be explained in more detail in the following text using exemplary embodiments and with reference to the drawings, in which.

DETAILED DESCRIPTION OF THE INVENTION

FIGS. 1 to 4 will not be described any further in the following text, since this has already been done above. Reference should be made to the above, for the explanation of the figures.

Figure 1:
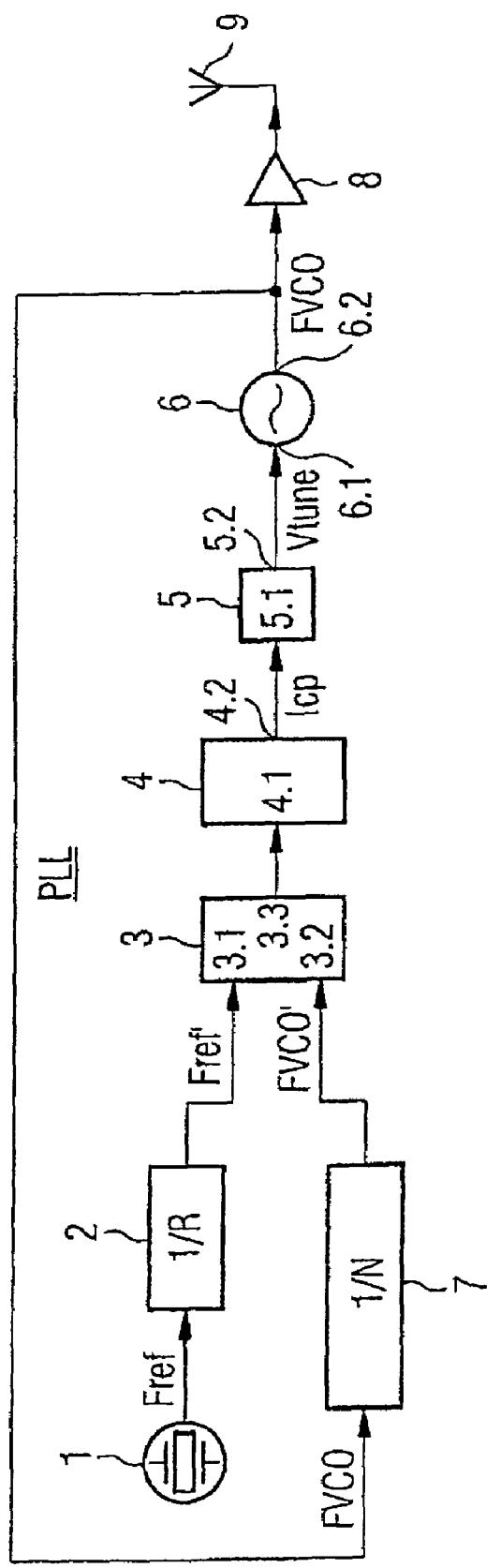
FIG. 1 is a block diagram illustrating a basic design of a phase locked loop that is known from the prior art.
Figure 2:
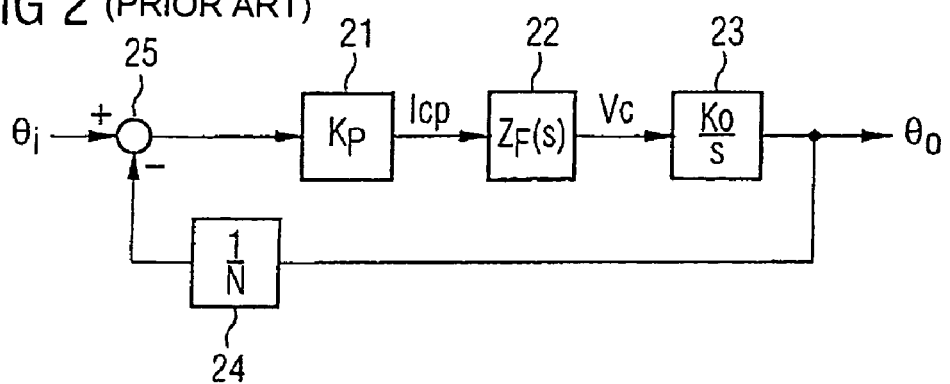
FIG. 2 is a control model diagram illustrating the phase locked loop shown in FIG. 1.
Figure 3:
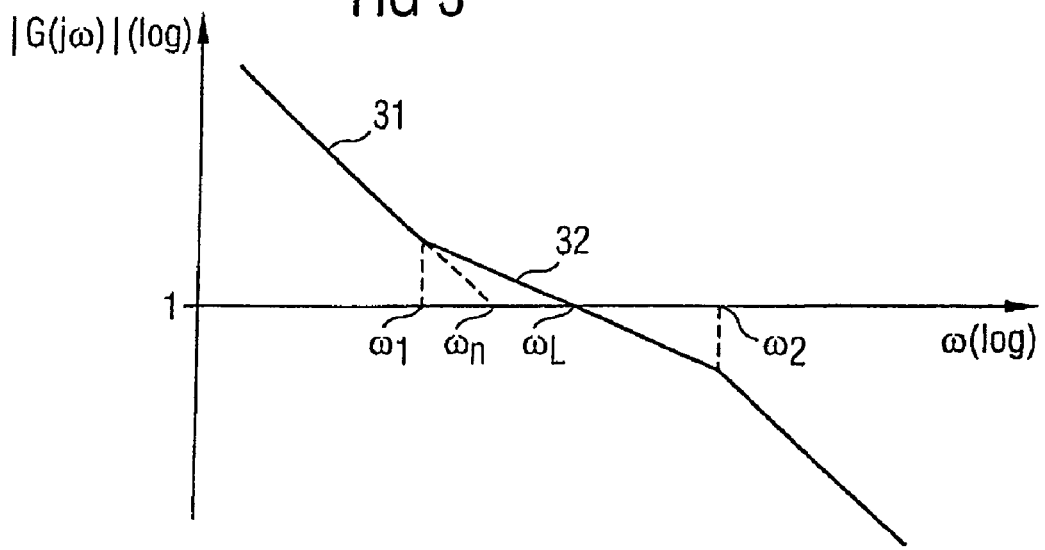
FIG. 3 is a graph illustrating an open control loop transfer function of a phase locked loop.
Figure 4:
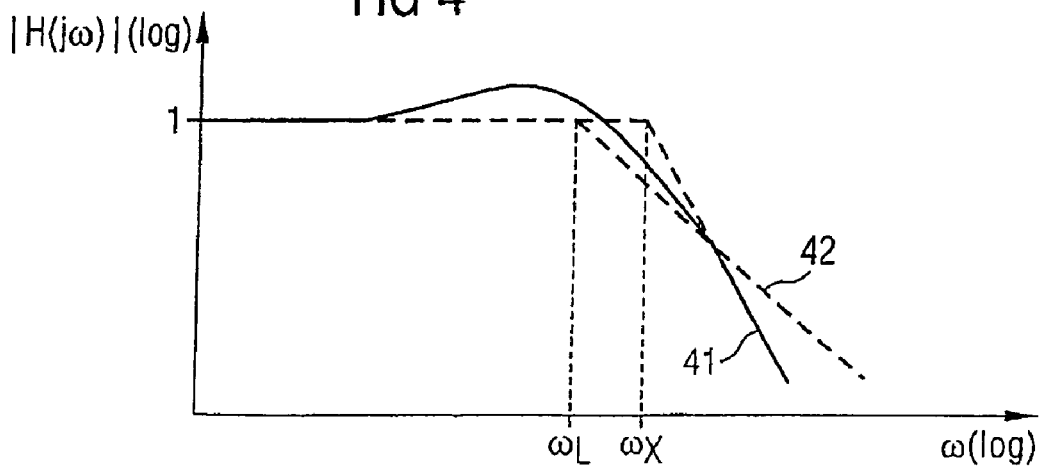
FIG. 4 is a graph illustrating a loop filter transfer function for various loop filter embodiments.
Figure 5:
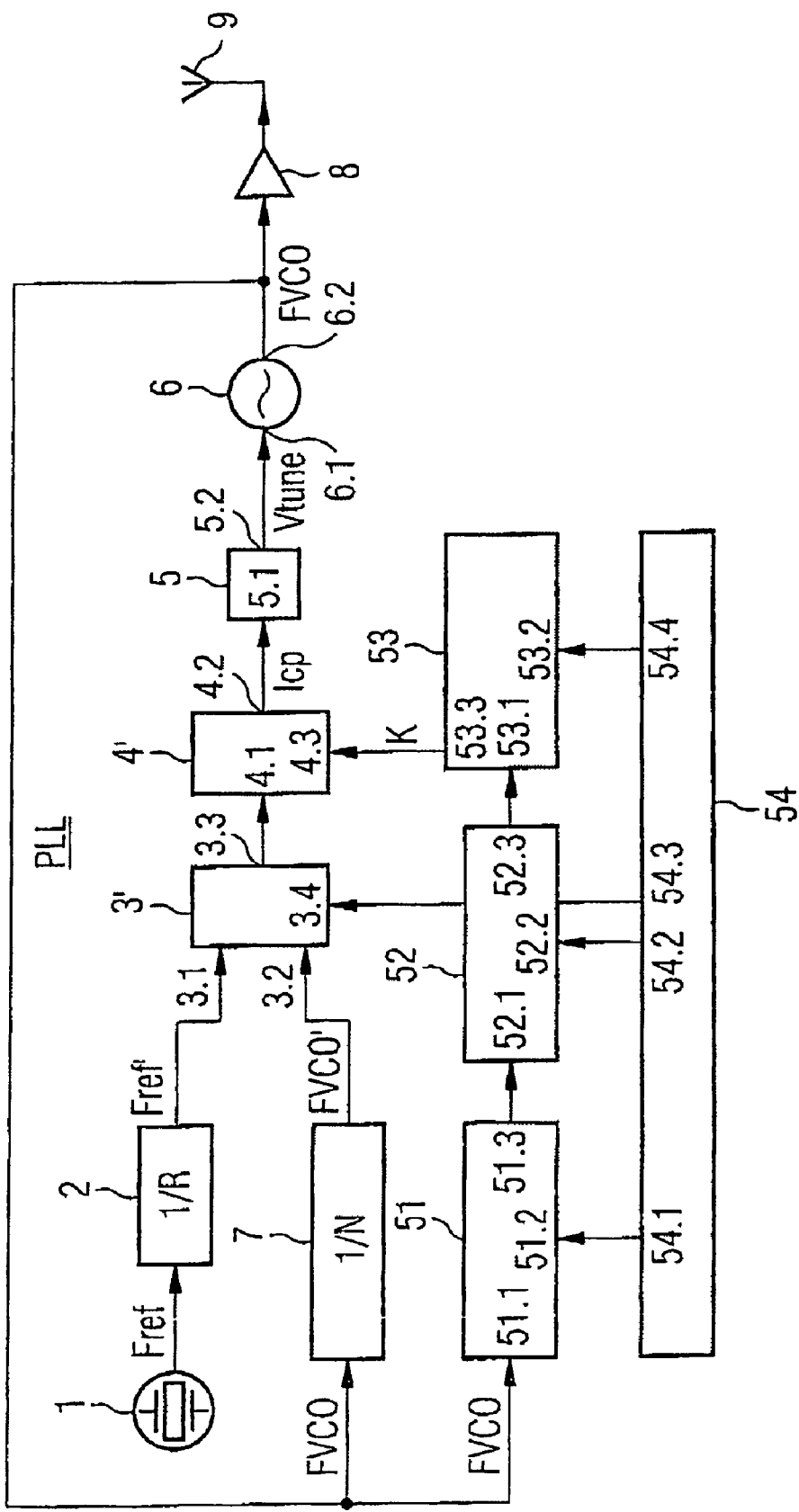
FIG. 5 is a block diagram illustrating one possible embodiment of the circuit arrangement according to the invention for phase control.

The basic design of the circuit arrangement according to the invention for phase control as illustrated in FIG. 5 has a phase locked loop which corresponds in some respects to the phase locked loop shown in FIG. 1. The phase locked loop is a component of the circuit arrangement according to the invention for phase control, with the invention not being restricted to the use of the phase locked loop shown in FIG. 1. In fact, any phase locked loop is in principle suitable for this purpose.

In contrast to the phase detector 3 that is shown in FIG. 1, the phase detector 3' that is shown in FIG. 5 has an additional control input 3.4, which is connected to a control output 54.3 of a control unit 54. Furthermore, the charge pump 4' in FIG. 5 differs from the charge pump 4 shown in FIG. 1 in that the charge pump 4' has an additional control input 4.3, which is connected to the output 53.3 of a computation unit 53. The output 6.2 of the voltage controlled oscillator 6 in FIG. 5 is additionally connected to a measurement input 51.1 of a frequency meter 51, which is used to detect the frequency FVCO that is produced by the voltage controlled oscillator 6.

As soon as the frequency meter 51 receives, via its control input 51.2, the appropriate control command from the control unit 54 via its control output 54.1, the frequency FVCO is detected, and is passed via the output 51.3 of the frequency meter 51 to a memory 52. The memory 52 is controlled via the control input 52.2, which is connected to the control output 54.2 of the control unit 54. As soon as the control unit 54 has transmitted the appropriate control command to the memory 52, the value for the frequency FVCO that is stored in the memory 52 is transmitted to the computation unit 53, via its input 53.1. As soon as the computation unit 53 has two available frequencies FVCO which have been measured by the frequency measurement unit 51, the gradient KVCO of the voltage controlled oscillator 6 is calculated. A correction value K which is obtained from this is passed via the output 53.3 of the computation unit 53 to the charge pump 4'.

The effective gradient KVCO of the voltage controlled oscillator 6 that actually occurs during operation is determined, and is then adjusted, by means of the circuit arrangement according to the invention for phase control. The adjustment or correction is based on the gradient KVCO. In the embodiment shown in FIG. 5, the correction is carried out via the charge pump current Icp of the charge pump 4' in the phase locked loop PLL. The loop gain of the phase locked loop is thus influenced.

The product of the gradient KVCO and of the charge pump current Icp (KVCO*Icp) and thus the loop bandwidth ωx are set and regulated to the desired or required value by means of the correction value K.

A synchronous or asynchronous divider of counter can be used, for example, as the frequency meter 51, which is also referred to as a frequency-processing unit.

If the computation unit 53 uses only two frequencies for calculation of the correction value K, then it is sufficient for the memory 52 to have two digital registers, for example a register A for the first frequency, and a register B for the second frequency.

One possible implementation of the invention will be described in the following text. First of all, via its control outputs 54.1 to 54.4, the control unit 54 sets all of the connected units, that is to say the frequency meter 51, the memory 52, the phase detector 3' and the computation unit 53, to a basic state. Via the control output 54.3, the control unit 54 then sets the phase detector 3' to a mode in which the phase detector 3' produces a first, fixed duty cycle PW1. A fixed ratio V1 between the tuning voltage Vtune and the VCO frequency FVCO is thus produced via the charge pump 4' and the loop filter 5, where V1=Vtune1/FVCO1=constant.

In a further step, via the control output 54.1, the control unit 54 causes the frequency meter 51 to carry out a frequency measurement and to pass the result, for example as a count cnt1, to the register A of the memory 52. In another step, the control unit 54 sets the phase detector 3' to a mode in which a second fixed duty cycle PW2 is produced. This results in a second, fixed ratio V2 being formed between the tuning voltage Vtune and the VCO frequency FVCO, for which V2=Vtune2/FVCO2=constant. Via the control output 54.1, the control unit 54 then causes the frequency meter 51 once again to carry out a further frequency measurement, and to transfer the measurement value cnt2 to the register B of the memory unit 52. Finally, the control unit 54 causes the computation unit 53 to calculate the gradient using the two measurement values cnt1 and cnt2, and to pass the corresponding correction value K to the charge pump 4'.

A calculation example will be described in the following text.

Charge pump current Icp(Kphi)=1 mA on 1 kOhm

Frequency of the voltage controlled oscillator: FVCO=~3000 MHz . . . 4000 MHz

The frequency counter 51 is activated for a specific time period, for example for 128/26 µs.

TABLE 1 ideal case:
Gradient KVCO = 60 MHz/V
Calculation of the nominal values:

| Unit | | T1a + b | | T2a + b |
|---|---|---|---|---|
| Duty cycle | PW1 | 1:4 | PW2 | 2:3 |
| Voltage | => Vtune1 | 0.2 | Vtune2 | 0.4 |
| Frequency | => FVCO1 | 3.500 E9 | FVCO2 | 3.512 E9 |
| Count after 128/26 µs | => cnt_nom1 | 17230.77 | cnt-nom2 | 17289.85 |
| Delta | => delta_cnt_nom | 59 | | | where:

cnt_nom1=first nominal count, corresponding to the measured first frequency, cnt_nom2=second nominal count, corresponding to the measured second frequency, delta_cnt_nom=nominal difference between cnt_nom_1 and cnt_nom_2.

TABLE 2 actual case:
The gradient KVCO is calculated to be:
KVCO = 75 MHz/V − (FVCO2 − FVCO1)/(Vtune2 − Vtune1)

| Unit | | | T1a + b | | T2a + b |
|---|---|---|---|---|---|
| Duty cycle | | PW1 | 1:4 | PW2 | 2:3 |
| Voltage | => | Vtune1 | 0.2 | Vtune2 | 0.4 |
| Frequency | => | FVCO1 | 3.484530 E9 | FVCO2 | 3.499630 E9 |
| Count after 128/26 μs | => | cnt1 (measured) | 17154.61 | cnt2 (measured) | 17228.95 |
| Delta | => | delta_cnt | 74.3 | | |

The computation unit 53 calculates the required correction factor K for the product KVCO*Icp to be:

$$K = KVCO\_aim/KVCO\_real = delta\_cnt\_nom/delta\_cnt = delta\_cnt\_nom/(cnt2-cnt1) = 0.797$$

The computation unit 53 uses this to produce the correction for the charge pump current Icp, by reducing it by 20.27%.

The product KVCO*Icp is constant, and the loop bandwidth ωx of the system is thus set to the desired value.

By way of example, the following algorithm can be implemented in order to achieve this.

$$CFT[5 \ldots 0] = ((DCNT\_NOM[9 \ldots 0] \; SHL2)/DCNT\_MEAS[12 \ldots 0]) - CFT\_OFF(4 \ldots 0)$$

In this case, DCNT_NOM is a 10 bit word, and represents a gradient KVCO of 60 MHz/V (ideally=59, see Table 1). SHL2 is a correction factor (*4) for calculation of the charge pump manipulated variable. DCNT_MEAS is a 13 bit word and represents the difference between the two measured frequencies cnt1 and cnt2. The units are pulses per period. CVT_OFF is a 5 bit word, which provides the necessary offset correction for the result (ideally=16).

The result CFT, which is annotated with K in FIG. 5, is a 6 bit word. This controls a digital/analog converter, which is provided directly in the charge pump 4. The result CFT has the value range 0 to 31. CFT=16 thus corresponds to the nominal charge pump current Icp=1000 μA. If the result is CFT=0, this corresponds to a reduction by 50% (ICP=500 μA) and, if CFT=31, this corresponds to an increase by 50% (Icp=1500 μA).

Both the nominal gradient DCNT_NOM and the offset correction value CFT_OFF are normally constant.

In one example, the main components of the computation unit 53 are a divider and a subtractor.

If the result of the computation unit 53 is not passed to the charge pump 4' but rather in another example is passed to the phase detector 3', although this is not shown in FIG. 5, the necessary correction factor K is calculated as already described, is weighted and is used for linear variation of the duty cycle in the phase detector 3'. This may be implemented using a digital/analog converter, for example by conversion of the correction word K to an analog delay, or completely digitally, for example by multiplexing delay chains or by the use of a programmable counter at a higher frequency.

As another alternative to this, although this is likewise not shown in FIG. 5, the computation unit 53 can also pass the correction value K to the loop filter 5. This is done, for example, by a digital/analog converter converting the correction word K to a programmable resistance. The effective transfer function, that is to say the loop bandwidth ωx of the phase locked loop as well, can thus be adapted for the measured gradient of the voltage controlled oscillator.

Finally, and also as an alternative to this, the collection value K can be passed directly from the computation unit 53 to the voltage controlled oscillator 6. By way of example, varactors in the voltage controlled oscillator core can be connected or disconnected in accordance with the calculated correction value, for control purposes.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

LIST OF REFERENCE SYMBOLS

1 Reference oscillator
2 1/R divider
3, 3' Phase detector
3.1 First input of the phase detector
3.2 Second input of the phase detector
3.3 Output of the phase detector
3.4 Control input
4, 4' Charge pump
4.1 Input of the charge pump
4.2 Output of the charge pump
4.3 Control input
5 Loop filter
5.1 Input of the loop filter
5.2 Output of the loop filter
6 Voltage controlled oscillator
6.1 VCO input
6.2 VCO output
7 1/N divider
8 Power amplifier
9 Antenna
25 Subtraction unit
21, 22, 23 Control path
24 Feedback path with a 1/N divider
31, 32 Sections of the transfer function
41, 42 Transfer functions of the filter
51 Frequency meter
51.2 Control input
52 Memory
5.2 Control input
53 Computation unit
53.2 Control input of the computation unit 54 Control unit
54.1–54.4 Control outputs
FVCO Frequency of the VCO
FVCO' Divided frequency of the VCO
Fref Reference frequency
Fref' Divided reference frequency
PLL Phase locked loop
K Correction value
Vtune Tuning voltage
Icp Charge pump current

The invention claimed is:

1. A circuit arrangement for phase control, comprising:
a phase locked loop configured to produce a controlled frequency, the phase locked loop comprising an actuating input and a voltage controlled oscillator portion provided at a control loop output of the phase locked loop at which the controlled frequency is provided;
a frequency meter connected to the control loop output of the phase locked loop and configured to measure the controlled frequency; and
a computation unit configured to determine a gradient associated with the voltage controlled oscillator portion of the phase locked loop based on the measured frequency, and generate a correction value based on the gradient, wherein the computation unit is connected to the actuating input and supplies the correction value thereto, the computation unit further comprising a first and a second memory connected to the frequency meter, and configured to store a first and a second frequency measured by the frequency meter for use in determining the gradient.

2. The circuit arrangement of claim 1, wherein the frequency meter comprises a counter.

3. The circuit arrangement of claim 1, wherein the phase locked loop further comprises a phase detector having a control input forming the actuating input of the phase locked loop.

4. The circuit arrangement of claim 1, wherein the phase locked loop further comprises a charge pump having a control input forming the actuating input of the phase locked loop.

5. The circuit arrangement of claim 1, wherein the phase locked loop further comprises a loop filter having a control input forming the actuating input of the phase locked loop.

6. The circuit arrangement of claim 1, wherein the voltage controlled oscillator portion comprises a control input that forms the actuating input of the phase locked loop.

7. The circuit arrangement of claim 1, further comprising a control unit configured to control the frequency meter, the first and second memories, and a portion of the phase locked loop associated with the actuating input.

8. A method for operating a phase locked loop, comprising:
measuring a first frequency using a frequency meter and storing the first frequency in a first memory;
measuring a second frequency using the frequency meter and storing the second frequency in a second memory;
determining and using a difference between the two stored frequencies to determine a gradient of a voltage controlled oscillator portion of the phase locked loop;
calculating a correction value using the determined gradient; and
producing a frequency with the phase locked loop using the correction value.

9. The method of claim 8, wherein determining the difference comprises interpolating between the first and second frequencies.

10. A phase locked loop system, comprising:
a phase locked loop circuit configured to generate an output frequency signal based on an input reference frequency signal, the phase locked loop circuit comprising a voltage controlled oscillator portion configured to generate the output frequency signal based on a tuning signal provided thereto, the phase locked loop circuit further comprising a compensation input; and
a compensation circuit configured to generate a compensation value and provide such compensation value to the compensation input of the phase locked loop circuit, wherein the compensation value is a function of a gradient associated with the voltage controlled oscillator portion of the phase locked loop circuit,
wherein the phase locked loop circuit is configured to modify an operation thereof based on the compensation value provided at the compensation input, thereby mitigating a deterioration in a loop bandwidth of the phase locked loop system associated with variations in the gradient of the voltage controlled oscillator portion of the phase locked loop circuit.

11. The phase locked loop system of claim 10, wherein the phase locked loop circuit further comprises:
a phase detector circuit configured to compare a reference frequency signal and a feedback signal that comprises a divided down version of the phase locked loop output signal, and generate a control signal in response to the comparison.

12. The phase locked loop system of claim 11, wherein the phase detector circuit is further configured to receive the compensation value and adjust the control signal based thereon.

13. The phase locked loop system of claim 11, wherein the phase locked loop circuit further comprises:
a charge pump circuit configured to receive the control signal from the phase detector circuit and generate a charge pump current signal in response thereto.

14. The phase locked loop system of claim 13, wherein the charge pump circuit is further configured to receive the compensation value and adjust the charge pump current signal based thereon.

15. The phase locked loop system of claim 13, wherein the phase locked loop circuit further comprises:
a loop filter circuit configured to receive the charge pump current signal from the charge pump circuit and generate the tuning signal in response thereto.

16. The phase locked loop system of claim 15, wherein the loop filter circuit is further configured to receive the compensation value and adjust the tuning signal based thereon.

17. The phase locked loop system of claim 10, wherein the compensation circuit further comprises:
a frequency detection circuit configured to measure a frequency of the output frequency signal at two different times, thereby ascertaining a first frequency value and a second frequency value; and
a computation unit configured to ascertain the gradient associated with the voltage controlled oscillator portion of the phase locked loop circuit based on the first and second frequency values, and generate the compensation value based thereon.

18. The phase locked loop system of claim 17, further comprising a control unit configured to control the frequency detection circuit, and computation circuit, and a portion of the phase locked loop circuit associated with the compensation input.

* * * * *